United States Patent [19]

Tong et al.

[11] Patent Number: 5,717,281
[45] Date of Patent: Feb. 10, 1998

[54] PHOTORESIST FOR CATHODE RAY TUBES THAT INCLUDES VINYL PYRROLIDONE-VINYLALCOHOL AND A DI-TETRAALKYLAMMONIUM SALT

[75] Inventors: Hua-Sou Tong, Arlington Heights, Ill.; Chun-Min Hu, Keelung; Yu-Chung Yu, Chungli, both of Taiwan

[73] Assignee: Chunghwa Picture Tubes, Ltd., Taoyuan, Taiwan

[21] Appl. No.: 678,814

[22] Filed: Jul. 12, 1996

Related U.S. Application Data

[63] Continuation-in-part of Ser. No. 424,907, Apr. 19, 1995, Pat. No. 5,536,994.

[51] Int. Cl.$^6$ .............................. H01J 29/10; H01J 31/00
[52] U.S. Cl. .................................. 313/461; 313/479
[58] Field of Search ........................... 313/461, 479; 359/106, 507; 430/28, 197

[56] References Cited

U.S. PATENT DOCUMENTS

| | | | |
|---|---|---|---|
| 3,146,368 | 8/1964 | Fiore et al. | 313/92 |
| 3,365,292 | 1/1968 | Fiore et al. | 96/36.1 |
| 3,582,701 | 6/1971 | Zellotis | 313/92 |
| 3,917,794 | 11/1975 | Akagi et al. | 427/68 |
| 4,197,133 | 4/1980 | Zweifel et al. | 430/195 |
| 4,442,196 | 4/1984 | Iwaki et al. | 430/197 X |
| 4,491,629 | 1/1985 | Koike et al. | 430/176 |
| 4,501,806 | 2/1985 | Watanabe et al. | 430/197 X |
| 4,792,516 | 12/1988 | Toriumi et al. | 430/196 |
| 4,954,418 | 9/1990 | Koike | 430/175 |
| 5,041,570 | 8/1991 | Tochizawa et al. | 552/8 |
| 5,326,675 | 7/1994 | Niki et al. | 430/326 |
| 5,336,575 | 8/1994 | Tong | 430/25 |
| 5,536,994 | 7/1996 | Tong et al. | 313/461 |

Primary Examiner—Sandra L. O'Shea
Assistant Examiner—Mack Haynes
Attorney, Agent, or Firm—Emrich & Dithmar

[57] ABSTRACT

The inner surface of a video display panel such as cathode ray tube (CRT) glass faceplate is initially coated with a mixture of one of the primary color phosphors, an organic binder such as polyvinyl alcohol (PVA) diluted with water, and a photoresist agent. The organic binder overcomes the poor adhesion to the glass faceplate of the photoresist which typically includes polyvinyl pyrrolidone (PVP) and reduces the oxygen which decreases phosphor exposure time. To overcome PVA and PVP incompatibilities which give rise to nonuniform film thickness, a vinyl pyrrolidone-vinyl alcohol (VP-VA) copolymer is added to the phosphor, organic binder and photoresist mixture in the range of 0.1–30 wt %. The copolymer with both the VP and VA functioning groups serves as a coupling agent between the PVA and PVP and eliminates incompatibilities between these components. The VP-VA copolymer preferably has a VP/VA mole ratio in the range of 20/80 to 80/20. The photoresist further includes a photosensitive tetraalkylammonium salt and water. By substituting the sodium disulfonate group in the prior an disodium salt with a di-tetraalkylammonium group, the water solubility of the salt is substantially increased permitting increased concentrations of the tetraalkylammonium salt to be used in the photoresist for improved video image contrast. The tetraalkylammonium salt also serves as a linking, or bonding, agent between VP-VA and PVP to prevent the VP-VA from being wiped away during CRT manufacture and for improved application of the photoresist to the glass faceplate.

6 Claims, 1 Drawing Sheet

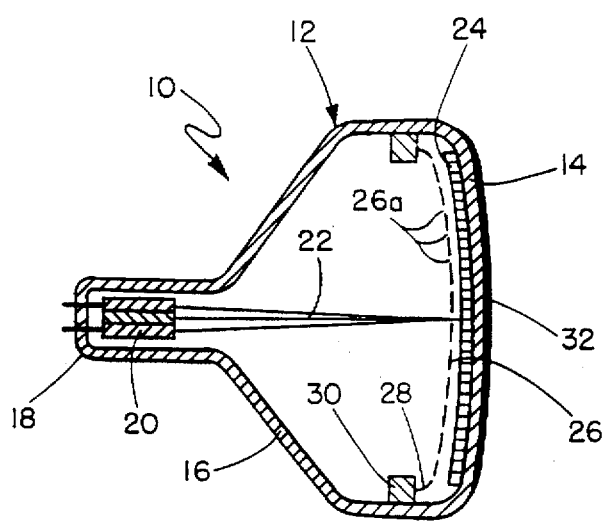
FIG. 1
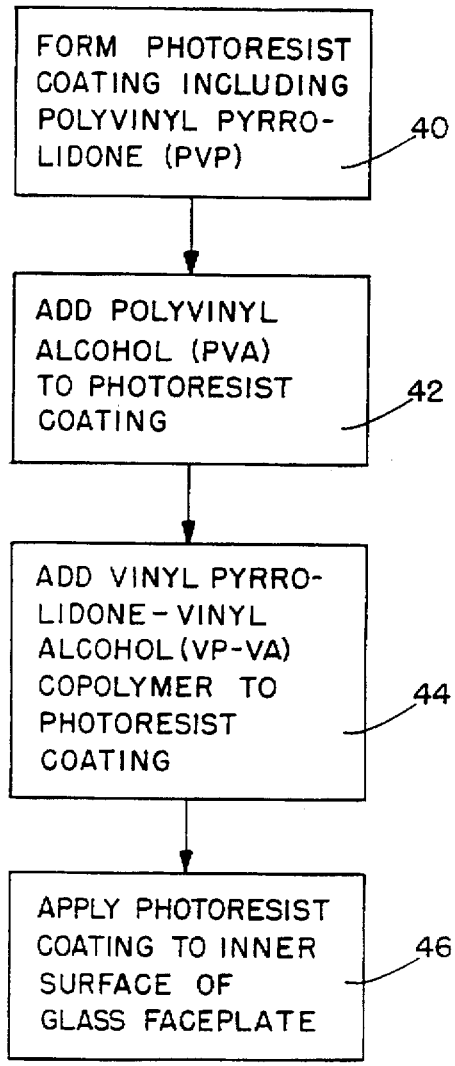

PHOTORESIST FOR CATHODE RAY TUBES THAT INCLUDES VINYL PYRROLIDONE-VINYLALCOHOL AND A DI-TETRAALKYLAMMONIUM SALT

This is a continuation-in-part of U.S. patent application Ser. No. 08/424,907, now U.S. Pat. No. 5,536,994 filed Apr. 19, 1995.

FIELD OF THE INVENTION

This invention relates generally to video displays such as of the cathode ray tube (CRT)-type having a display screen with a light emitting phosphor, and is particularly directed to a photoresist coating for the inner surface of a display screen which provides improved video image color contrast.

BACKGROUND OF THE INVENTION

The basic screen printing technique for the glass display screen of a CRT involves exposure of a light-sensitive colloid. The exposed area becomes insoluble and remains after development. On the other hand, in the black matrixing approach designed to improve color contrast, the matrix printing requires a process that has the reverse polarity because the matrix openings should be clear with the surrounding area black. This phosphor screening process involves the application of a photoresist applied to the display screen's inner surface. The photoresist typically includes polyvinyl pyrrolidone (PVP), 4,4"-diazidostilbene-2,2" disulfonic acid, disodium salt and water. Adhesion of this photoresist to the CRT glass faceplate has always been a problem giving rise to reduced production yields. To overcome this problem, polyvinyl alcohol (PVA) is added to the photoresist material. Addition of the PVA provides two benefits. First, adhesion between the photoresist and the glass faceplate is substantially improved. Secondly, addition of the PVA to the photoresist serves to depress the oxygen level, resulting in a decrease in the time required for the photoresist to be exposed to ultraviolet light for curing. However, because of an incompatibility between PVP and PVA, the addition of the PVA to the photoresist material makes it more difficult to apply the photoresist to the glass faceplate in the form of a thin film having a uniform thickness.

Another problem encountered when PVA is added to the photoresist material containing PVP relates to the water solubility and photosensitivity of the disodium salt in the photoresist. The limited water solubility of the disodium salt, i.e., disodium 4-4"-diazidostilbene 2,2"-disulfonate, results in limited photosensitivity of the photoresist resulting, in turn, in low video image color contrast.

The present invention addresses the aforementioned problems encountered in the prior art by allowing for the addition of PVA to a photoresist coating solution for providing a high degree of adhesion of the coating to a glass faceplate while allowing the coating to be applied to the faceplate in the form of a thin film of highly uniform thickness. In addition, the disodium salt is replaced with a tetraalkylammonium salt having greater solubility in water to further improve video image color contrast.

OBJECTS AND SUMMARY OF THE INVENTION

Accordingly, it is an object of the present invention to provide an improved photoresist material for coating the inner surface of the glass display panel of a video display device such as a CRT.

It is another object of the present invention to modify a conventional photoresist material so as to eliminate problems of incompatibility between the photoresist material components allowing the material to be applied to a glass display panel in the form of a thin film having a highly uniform thickness.

A further object of the present invention is to increase production yield in the manufacture of video display screens such as employed in a CRT by applying a photoresist coating to the surface of the display screen having a highly uniform thickness.

A still further object of the present invention to increase the concentration of the photosensitive component in the photoresist coating of a video display screen for improved video image contrast.

These objects of the present invention are achieved and the disadvantages of the prior art are avoided by a photoresist coating disposed on an inner surface of a glass video display panel, the photoresist coating including polyvinyl pyrrolidone (PVP) and polyvinyl alcohol (PVA), the improvement comprising: a vinyl pyrrolidone—vinyl alcohol (VP-VA) copolymer added to the photoresist coating to allow the photoresist coating to be applied to the glass video display panel as a thin film having a highly uniform thickness. This invention further contemplates an improvement in a photoresist coating disposed on an inner surface of a glass video display panel, where the photoresist coating includes polyvinyl pyrrolidone (PVP), polyvinyl alcohol (PVA), VP-VA copolymer, and water, the improvement comprising a tetraalkylammonium salt added to the photoresist for providing a bond between the VP-VA copolymer and PVP to reduce the possibility of wiping the VP-VA from the display panel during CRT manufacture and for increasing the concentration of the photosensitive salt in water for enhanced video image contrast.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

FIG. 1 is a longitudinal sectional view of a CRT incorporating a photoresist coating on the inner surface of its glass faceplate in accordance with the principles of the present invention; and FIG. 2 is a flow chart illustrating the steps involved in preparing and applying a photoresist mating in accordance with the present invention to the inner surface of a video display glass faceplate.

DETAILED DESCRIPTION OF THE PREFERRED EMBODIMENT

Referring to FIG. 1, there is shown in sectional view of a color CRT 10 incorporating a phosphor-based photoresist coating 24 in accordance with the principles of the present invention. In the following discussion the terms "display screen", display panel" and "faceplate" are used interchangeably. CRT 10 includes a sealed glass envelope 12 having a forward faceplate or display screen 14, an aft neck portion 18, and an intermediate funnel portion 16. The photoresist coating 24 includes a plurality of discrete phosphor deposits, or elements, which emit light when an electron beam is incident thereon to produce a video image on the faceplate. Color CRT 10 includes three electron beams 22 directed onto and focused upon the CRT's glass faceplate 14. Disposed in the neck portion 18 of the CRT's glass envelope 12 are a plurality of electron guns 20 typically arranged in an inline array for directing the electron beams 22 onto the display screen 14. The electron beams 22 are deflected vertically and horizontally in unison across the phosphor-based photoresist coating 24 by a magnetic deflection yoke which is not shown in the figure for simplicity. Disposed in a spaced manner from phosphor screen 24 is a shadow mask 26 having a plurality of spaced electron beam passing apertures 26a and a skin portion 28 around the periphery thereof. The shadow mask skirt portion 28 is securely attached to a shadow mask mounting fixture 30 around the periphery of the shadow mask. The shadow mask mounting fixture 30 is attached to an inner surface of the CRT's glass envelope 12 and may include conventional attachment and positioning structures such as a mask attachment frame and a mounting spring which also are not shown in the figure for simplicity. The shadow mask mounting fixture 30 may be attached to the inner surface of the CRT's glass envelope 12 and the shadow mask 26 may be attached to the mounting fixture by conventional means such as weldments or a glass-based frit. Disposed on the outer surface of display screen 14 is an antistatic/antireflection coating 32.

Referring to FIG. 2, there is shown in block diagram form a flow chart illustrating the steps involved in preparing and applying a photoresist coating to the inner surface of a video display glass faceplate in accordance with one aspect of the present invention. At step 40, the photoresist coating is formed so as to include polyvinyl pyrrolidone (PVP), 4,4"-diazidostilbene-2,2" disulfonic acid, disodium salt and water. In a preferred embodiment, the disodium salt is replaced with a tetraalkylammonium salt as described in detail below. To the photoresist coating containing the PVP, a polyvinyl alcohol (PVA) is added at step 42 to increase adhesion of the coating to the glass faceplate of a video display. The addition of the PVA not only increases adhesion of the photoresist coating to the glass faceplate, but also results in a reduction in oxygen permitting a reduced exposure period of the photoresist coating to ultraviolet light during curing following deposit on the glass faceplate. In order to overcome an incompatibility between the PVP and PVA, a vinyl pyrrolidone-vinyl alcohol (VP-VA) copolymer is added to the photoresist coating at step 44. The addition of the VP-VA copolymer in the range of 0.1–30 wt % to the photoresist coating overcomes the incompatibility between the PVP and PVA allowing the coating to be applied to the glass faceplate in the form of a thin film having a more uniform thickness over the faceplate's entire inner surface. The VP-VA copolymer is added to the photoresist coating in the range of 0.1–30 wt %. The copolymer has both the VP and VA functional groups which serve as a coupling agent bridging PVP and PVA together for essentially eliminating the incompatibility problem between the PVA and PVP. The VP-VA copolymer added to the photoresist coating preferably has a VP/VA mole ratio in the range of 20/80 to 80/20. A specific example of a photoresist coating in accordance with the present invention has the following composition:

Azide: 0.5 gr.

PVP: 5 gr.

PVA: 2.5 gr.

Water: 100 gr.

VP-VA: 5.0 wt %

As in the prior art, the photoresist coating 24 includes the aforementioned PVA and PVP as well as a photosensitive disodium salt and water. In accordance with the present invention, a tetraalkylammonium group is substituted for the sodium disulfonate group in the disodium salt. Prior art photoresist materials typically include a disodium salt such as, for example, one of the following three varieties of sodium salts:

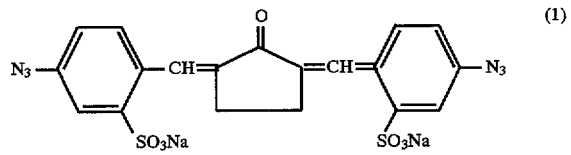

Disodium 2,6-Di (p-azidobenzal)-cyclopentanone 2,2'-disulfonate

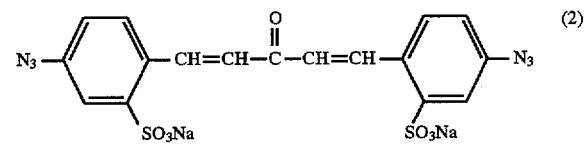

Disodium 2,2'-(1,5 penta-3-one-1,4-dieenyl) bis (5-azidobenzene sulfonate)

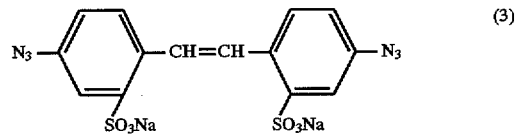

Disodium 4,4'-diazidostilbene-2,2'-disulfonate

The present invention substitutes the sodium di-sulfonate group with a di-tetraalkylammonium group, i.e., $^+N(R)_4$, where R represents an alkyl group such as $-CH_3$, $-C_2H_5$, etc. The photosensitive tetraalkylammonium salt serves as a linking, or bonding, agent between the VP-VA copolymer and PVP to reduce the possibility of wiping the VP-VA from the display panel during CRT manufacture. Typical tetraalkylammonium salts used in the photoresist of the present invention are listed as follows:

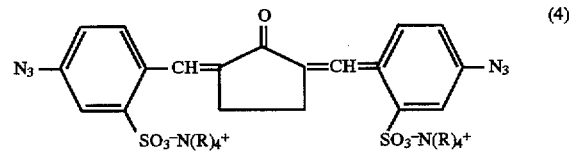

Di(tetraalkylammonium)-2,6-Di(p-azidobenzal)-cyclopentanone 2,2'-disulfonate

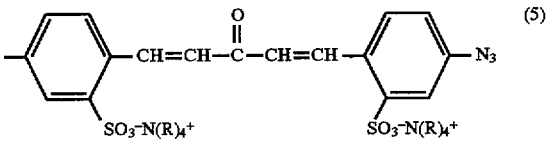

Di(tetraalkylammonium)-2,2'-(1,5 penta-3-one-1,4-dieenyl) bis (5-azidobenzene-disulfonate)

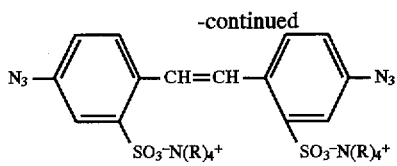

Di(tetraalkylammonium)-4,4'-diazostilbene-2,2'-disulfonate

The compounds set forth in formulas (4), (5), and (6) are activated by ultraviolet (UV) radiation at a wavelength on the order of 337 nm. This wavelength is on the order of the activation wavelength for the prior art disodium 4,4"-diazidostilbene 2,2"-disulfonate, i.e., 335 nm. However, the water solubility of the compounds set forth in formulas (4), (5) and (6) is on the order of 15%, which is much higher than the 4% water solubility of disodium 4,4"-diazidostilbene 2,2"-disulfonate, and the other two prior art compounds set forth in formulas (1) and (2) above. With this higher water solubility, much larger concentrations of photosensitive compounds having the compositions set forth in formulas (4), (5) and (6) can be incorporated in the photoresist material than the proportions of the prior art compounds set forth in formulas (1), (2) and (3) to provide the photoresist material with enhanced photosensitivity.

There has thus been shown an improved photoresist coating for the inner surface of a video display panel such as in a CRT which has a high degree of adhesion to the glass display panel and can be applied to the inner surface of the display panel in the form of a thin film having a high degree of uniformity in thickness. The photoresist coating includes PVP to which is added PVA to increase adhesion between the photoresist coating and the glass display panel as well as to reduce the oxygen to permit a decrease in the exposure time of the photoresist to ultraviolet light during curing. Incompatibilities between the PVP and PVA are compensated for by the addition of a VP-VA copolymer to permit the photoresist coating to be applied to the display panel's inner surface in the form of a thin film having a highly uniform thickness. The improved photoresist coating further includes a photosensitive tetraalkylammonium salt having increased solubility in water to permit more photosensitive salt to be incorporated in the photoresist for enhanced photosensitivity. The enhanced photosensitivity of the photoresist material provides improved color contrast for a video image on the CRT. The tetraalkylammonium salt also serves as a linking agent between the VP-VA copolymer and the PVP.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

We claim:

1. In a photoresist coating disposed on an inner surface of a glass video display panel, said photoresist coating including polyvinyl pyrrolidone (PVP), polyvinyl alcohol (PVA), and water, the improvement comprising:

a vinyl pyrrolidone-vinyl alcohol (VP-VA) copolymer added to said photoresist coating to allow said photoresist coating to be applied to said glass video display panel as a thin film having a uniform thickness; and a photosensitive di-tetraalkylammonium salt having a di-tetraalkylammonium group $^+N(R)_4$ added to said photoresist coating, wherein said di-tetraalkylammonium group provides said salt with high solubility in water allowing for increased concentrations of said salt in the photoresist coating for enhanced video image contrast.

2. The improvement of claim 1 wherein said di-tetraalkylammonium salt is selected from the group consisting of Di(tetraalkylammonium)-2,6-Di(p-azidobenzal)-cyclopentanone 2,2'-disulfonate; Di(tetraalkylammonium)-2,2'-(1,5 penta-3-one-1,4-dieenyl)bis(5-azidobenzene-disulfonate); and Di(tetraalkylammonium)-4,4'-diazostilbene-2,2'-disulfonate.

3. A method for preparing a photoresist coating for use on an inner surface of a glass video display panel, said method comprising the steps of:

forming a coating solution comprised of polyvinyl pyrrolidone (PVP), 4-4"-diazidostilbene-2,2", and water;

adding polyvinyl alcohol (PVA) to said coating solution to improve adhesion of said coating solution to the glass video display panel;

adding a vinyl pyrrolidone-vinyl alcohol (VP-VA) copolymer to said coating solution, wherein said VP-VA copolymer serves as a coupling agent between said PVP and PVA for allowing said coating solution to be applied to the glass video display panel in the form of a thin film having a highly uniform thickness; and adding a photosensitive di-tetraalkylammonium salt having a di-tetraalkylammonium group to said coating solution for rendering said coating solution highly responsive to light for improved video image contrast.

4. The method of claim 3 including the step of adding a photosensitive di-tetraalkylyammonium salt selected from the group consisting of Di(tetraalkylammonium)-2,6-Di(p-azidobenzal)-cyclopentanone 2,2'-disulfonate; Di(tetraalkylammonium)-2,2"-(1,5 penta-3-one-1,4-dieenyl)bis(5-azidobenzene-disulfonate); and Di(tetraalkylammonium)-4,4'-diazostilbene-2,2'-disulfonate.

5. A cathode ray tube glass faceplate having a coating on an inner surface thereof comprising:

a photoresist coating solution including polyvinyl pyrrolidone (PVP) in water disposed on the inner surface of the glass faceplate;

polyvinyl alcohol (PVA) disposed in said photoresist coating for adherence of the photoresist coating solution to the inner surface of the cathode ray tube glass faceplate;

a vinyl pyrrolidone-vinyl alcohol (VP-VA) copolymer disposed in said photoresist coating for allowing said photoresist coating to be applied to the glass faceplate as a thin film having a highly uniform thickness; and a photosensitive di-tetraalkylammonium salt having a di-tetraalkylammonium group disposed in said photoresist coating for increasing the concentration of a photosensitive salt in said coating and improving video image contrast.

6. The cathode ray tube faceplate of claim 5 wherein said photosensitive di-tetraalkylammonium salt is selected from the group consisting of Di(tetraalkylammonium)-2,6-Di(p-azidobenzal)-cyclopentanone 2,2'-disulfonate; Di(tetraalkylammonium)-2,2'-(1,5 penta-3-one-1,4-dieenyl)bis(5-azidobenzene-disulfonate); and Di(tetraalkylammonium)-4,4'-diazostilbene-2,2'-disulfonate.

* * * * *

UNITED STATES PATENT AND TRADEMARK OFFICE
CERTIFICATE OF CORRECTION

PATENT NO. : 5,717,281
DATED : February 10, 1998
INVENTOR(S) : HUA-SOU TONG et al.

It is certified that error appears in the above-indentified patent and that said Letters Patent is hereby corrected as shown below:

| COLUMN | LINE | |
|---|---|---|
| ABSTRACT | 19 | The word "an" should be -- art --. |
| 2 | 52 | The word "mating" should be -- coating --. |
| 3 | 14 | The word "skin" should be -- skirt -- |
| 4 | 9 | The word "an" should be -- art --. |

Signed and Sealed this

Thirtieth Day of June, 1998

Attest:

BRUCE LEHMAN

Attesting Officer

Commissioner of Patents and Trademarks